(12) United States Patent
Retz et al.

(10) Patent No.: US 10,008,313 B2
(45) Date of Patent: Jun. 26, 2018

(54) CRYOSTAT AND METHOD FOR REDUCING HEAT INPUT INTO A CRYOSTAT

(71) Applicant: Siemens plc, Camberley (GB)

(72) Inventors: Patrick William Retz, Witney (GB); Neil Charles Tigwell, Witney (GB)

(73) Assignee: Siemens Healthcare Limited, Camberley (GB)

( * ) Notice: Subject to any disclaimer, the term of this patent is extended or adjusted under 35 U.S.C. 154(b) by 341 days.

(21) Appl. No.: 14/669,356

(22) Filed: Mar. 26, 2015

(65) Prior Publication Data
US 2015/0276129 A1   Oct. 1, 2015

(30) Foreign Application Priority Data
Mar. 27, 2014   (GB) .................... 1405537.0

(51) Int. Cl.
| | |
|---|---|
| *F17C 3/08* | (2006.01) |
| *H01F 6/04* | (2006.01) |
| *F25D 19/00* | (2006.01) |
| *G01R 33/38* | (2006.01) |
| *G01R 33/3815* | (2006.01) |

(52) U.S. Cl.
CPC ............. *H01F 6/04* (2013.01); *F25D 19/00* (2013.01); *G01R 33/3804* (2013.01); *G01R 33/3815* (2013.01)

(58) Field of Classification Search
CPC ........... F25D 19/00; F25D 19/006; H01F 6/04
See application file for complete search history.

(56) References Cited

U.S. PATENT DOCUMENTS

| | | | |
|---|---|---|---|
| 5,339,650 A | 8/1994 | Hakamada et al. | |
| 2007/0214802 A1* | 9/2007 | Nemoto | F25B 9/10 62/47.1 |
| 2009/0107150 A1* | 4/2009 | Yuan | F25B 9/145 62/6 |

FOREIGN PATENT DOCUMENTS

GB    2389647    12/2003

* cited by examiner

*Primary Examiner* — Brian King
(74) *Attorney, Agent, or Firm* — Schiff Hardin LLP

(57) ABSTRACT

In a cryostat, in particular for use in a magnetic resonance imaging (MRI) system, and a method for reducing heat input into such a cryostat, an insert is provided that is adapted to be inserted into an opening of the cryostat. The insert is adapted to provide one or more passageways for a cryogen through the opening by defining at least one space between the outer surface of the insert and at least one part of the inner surface of the opening. This space allows the cryogen to pass over the part of the inner surface of the opening.

19 Claims, 3 Drawing Sheets

CRYOSTAT AND METHOD FOR REDUCING HEAT INPUT INTO A CRYOSTAT

BACKGROUND OF THE INVENTION

Field of the Invention

The invention relates to a cryostat, in particular for use in a magnetic resonance imaging (MRI) system. Furthermore, the invention relates to a method for reducing heat input into a cryostat.

Description of the Prior Art

Superconducting magnet systems are used for medical diagnosis, for example in magnetic resonance imaging systems. A requirement of an MRI magnet is that it produces a stable, homogeneous, magnetic field. In order to achieve the required stability, it is common to use a superconducting magnet system which operates at very low temperature. The temperature is typically maintained by cooling the superconductor by immersion in a low temperature cryogenic fluid, also known as a cryogen, such as liquid helium.

The superconducting magnet system typically comprises a set of superconductor windings for producing a magnetic field, the windings being immersed in a cryogenic fluid to keep the windings at or below the superconducting temperature, the superconductor windings and the cryogen being contained within a cryogen vessel. The cryogen vessel is typically surrounded by one or more thermal shields, and a vacuum jacket completely enclosing the shield(s) and the cryogen vessel.

An access neck typically passes through the vacuum jacket from the exterior, into the cryogen vessel. Such access neck is used for filling the cryogen vessel with cryogenic fluids and for passing services into the cryogen vessel to ensure correct operation of the magnet system.

Cryogenic fluids, and particularly helium, are expensive and it is desirable that the magnet system should be designed and operated in a manner to reduce to a minimum the amount of cryogen consumed. Heat leaks into the cryogen vessel will evaporate the cryogen, which might then be lost from the magnet system as boil-off. In order to reduce the heat leaking into the cryogen vessel, and thus the loss of liquid, it is common practice to use a refrigerator to cool the thermal shields to a low temperature.

It is desirable that such superconducting magnet systems should be transported from the manufacturing site to the operational site containing the cryogen, so that they can be made operational as quickly as possible. In the case when the cryogen has been depleted, the system begins to warm-up and, if it exceeds a critical temperature, the magnet has to be pre-cooled with liquid nitrogen and then re-filled with the cryogen which is a time consuming and expensive process.

During transportation of an already assembled system, the refrigerator provided to cool the one or more shields and/or the cryogen vessel is inactive, and is incapable of removing the heat load from the shield and/or the cryogen vessel. Indeed, the refrigerator itself provides a low thermal resistance path for ambient heat to reach the cryogen vessel and shield(s). This in turn means a relatively high level of heat input during transportation, leading to loss of cryogen liquid by boil-off to the atmosphere.

It is desirable to reduce the loss of cryogen to the minimum possible, both since cryogens are costly and in order to prolong the time available for delivery, also known as the hold time, the time during which the system can remain with the refrigerator inoperable, but still contain some cryogen.

It is well known that the cold gas from evaporating cryogenic fluids can be employed to reduce heat input to cryogen vessels, by using the cooling power of the gas to cool the access neck of the cryogen vessel and to provide cooling to thermal shields by heat exchange with the cold exhausting gas.

Further, it has been demonstrated that removing the refrigerator and replacing the refrigerator with a heat exchanger can noticeably reduce the heat load onto the internal parts of the system, and therefore reduce the loss of cryogen. However, further improvement is desired.

SUMMARY OF THE INVENTION

It is an object of the present invention to provide a simple and reliable technique to reduce heat input into a cryostat during transportation.

This object is achieved according to the invention by a cryostat that has an opening, in particular in the form of an access neck, a refrigerator interface, or the like, and that further has an insert removably positioned in the opening, wherein the insert is adapted to provide one or more passageways for a cryogen through the opening by defining at least one space between the outer surface of the insert and at least one part of the inner surface of the opening, this space allowing the cryogen to pass over the part of the inner surface of the opening.

The object of the present invention is also achieved by a method for reducing heat input into a cryostat, in particular during transportation of the cryostat, that includes the step of inserting an insert in an opening of the cryostat, which insert provides, once positioned into the opening, one or more passageways for a cryogen through the opening by defining at least one space between the outer surface of the insert and at least one part of the inner surface of the opening, this space allowing the cryogen to pass over the part of the inner surface of the opening.

The present invention is based upon the insight that not only does the refrigerator provide a low thermal resistance path for heat input into a cryostat during cold shipment, but also that the opening itself provides such a path for heat input into the cryostat. In particular the walls of the access neck or of other openings, which extend from the outside of the cryostat into the cryogenic vessel, create such heat paths.

This is true not only for the one opening of the cryostat which receives the refrigerator, but also for all other openings of the cryostat, which provide passages into the cryogenic vessel of the cryostat.

Therefore, a basis of the invention is to specifically target the warm inner surfaces of such openings in order to cool these inner surfaces by deliberately causing the cold cryogen gas to pass over these surfaces, reducing the parasitic heat load in a simple, reliable and very effective way.

Preferably, the insert is adapted such that the only way for the cryogen to pass through the opening is through the one or more passageways provided between the insert and the opening. In other words, the complete amount of cryogen gas to be exhausted is used in a particularly effective way for cooling purposes.

In order to provide a very effective way of cooling the inner surface of the opening, the insert is preferably adapted in a way that it fills out substantially the complete volume of the opening, once inserted into the opening. In other words, the insert is preferably formed in a way that there are no significant empty volumes within the opening, once the insert is inserted into the opening. Preferably, more or less the complete volume of the opening is filled with the insert, with the exception of the passageway(s) along the opening's inner surface.

According to a preferred embodiment of the invention the outer surface of the insert comprises structural elements, which are adapted to increase the length of the passageway through the opening. In other words, the structural elements are adapted to increase the period of time the cryogen passes over the inner surface of the opening. This even further improves the heat exchange and hence lowers the warm surface temperature.

According to a preferred embodiment of the invention the structural elements are spiral ridges, which are adapted to provide a spiraled passageway around the outer surface of the insert.

According to a preferred embodiment of the invention the outer surface of the insert is provided by walls made of low thermal conductivity material, said walls defining the hollow body of the insert. In this case, the insert is preferably being evacuated. According to an alternative embodiment of the invention the insert is a solid body made of low thermal conductivity foam. Both measures help to support the cooling effect of the passing cryogen fluid and to reduce the parasitic heat load.

In a preferred embodiment of the invention, such inserts are inserted into all suitable openings of the cryostat. In this case, the refrigerator and any other removable part are preferably removed from the said openings prior to inserting the inserts into it, in order to eliminate additional heat load caused by these removable parts.

DESCRIPTION OF THE PREFERRED EMBODIMENTS

Figure 1:
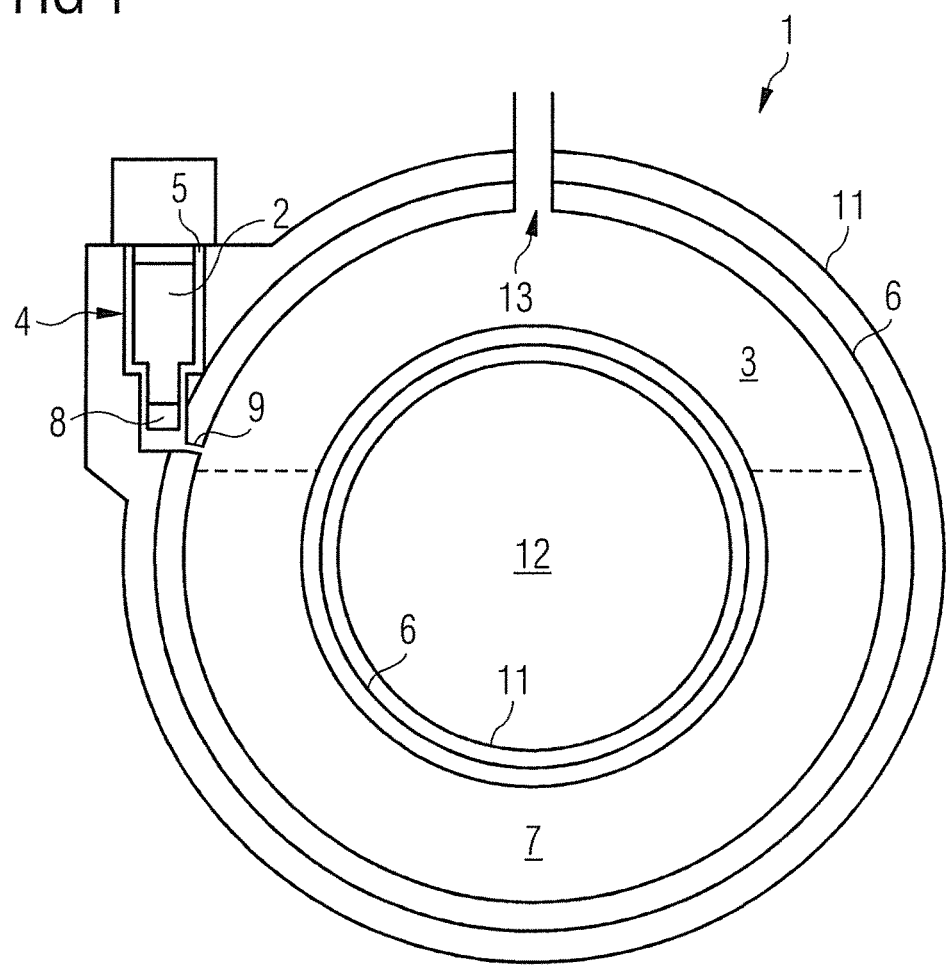
FIG. 1 is a schematic illustration of a cryostat.

A cross-section of a superconducting magnet system 1 for use in an MRI system is illustrated in FIG. 1. A cryogenic refrigerator 2 is removably connected to the magnet system 1 by a refrigerator interface sock 4 (also known as an interface sleeve, or refrigerator interface) such that the refrigerator 2 is positioned in a receiving opening 5 of the interface sock 4. Thereby, a first stage of the refrigerator cools a thermal shield 6 and a second stage cools the gas in the cryogen vessel 3. A heat exchanger 8, cooled by the second stage of the refrigerator 2, is exposed to the interior of the cryogen vessel 3, for example by a tube 9.

Superconductive magnet coils (not shown) are provided in the cryogen vessel 3. The coils are immersed in a liquid cryogen 7, e.g. liquid helium. The thermal shield 6 completely surrounds the cryogen vessel 3. A vacuum jacket 11 completely encloses the cryogen vessel 3 and the shield 6 in a vacuum. A central bore 12 is provided to accommodate a patient for examination. An access neck 13 is provided to allow access to the cryogen vessel 3.

During transportation, when the refrigerator 2 is inoperative, boil-off of the cryogen 7 will occur. In a standard configuration, when the refrigerator 2 and heat exchanger 8 are not removed from the receiving opening 5, boil-off gas generated in cryogen vessel 3 may leave the vessel either by the access neck 13, or through the tube 9, through the interface sock 4 past the refrigerator 2.

Heat load on the cryogen vessel 3 during transportation comes from a number of sources, including the access neck 13 and the refrigerator interface sock 4, and by radiation.

According to the present invention, for the purpose of transportation, the refrigerator 2 as well as any other removable device, e.g. the heat exchanger 8, is removed from its position within the receiving opening 5, in order to reduce heat load. For further reduction of heat load, an insert 14 is removably inserted into the interface sock 4, as shown in more detail in FIG. 2. After the transport of the superconducting magnet system 1 to the operational site has been completed, the insert 14 is removed and the refrigerator 2 as well as any other devices removed is fitted into the interface sock 4 again.

The insert 14 may be formed as hollow body defined by walls made of low thermal conductivity material, such as stainless steel or plastic. Preferably, the insert 14 is evacuated to minimize heat transfer. The top surface 15 of the insert 14 is covered in low emissivity material to reduce the incident radiation heat load from the top-plate 16, which covers the receiving opening 5.

The shape of the insert 14 corresponds to the inner contour of the receiving opening 5 of the interface sock 4. In addition, the insert 14 extends preferably along the entire length 17 or essentially along the entire length 17 of the receiving opening 5. The outer dimensions of the insert 14 are smaller than the inner dimensions of the receiving opening 5 such that, once inserted into the opening 5, the insert 14 defines a space 18 between the outer surface 19 of the insert 14 and the inner surface 21 of the opening 5. This space 18 provides a passageway for the boil-off cryogen 7 through the opening 5, thereby passing over the warm surfaces 21 of the receiving opening 5.

In order to force the cryogen 7 to pass over the inner surfaces 21 of the receiving opening 5, the defined space 18 between the outer and inner surfaces 19, 21 is preferably very small such that the cryogen 7 passes in close proximity over the inner surfaces 21 of the receiving opening 5 in order to provide good thermal contact to the inner surfaces 21. Preferably, the average distance between the outer surface 19 of the insert 14 and the inner surface 21 of the receiving opening 5 is typically a few millimeters.

Figure 2:
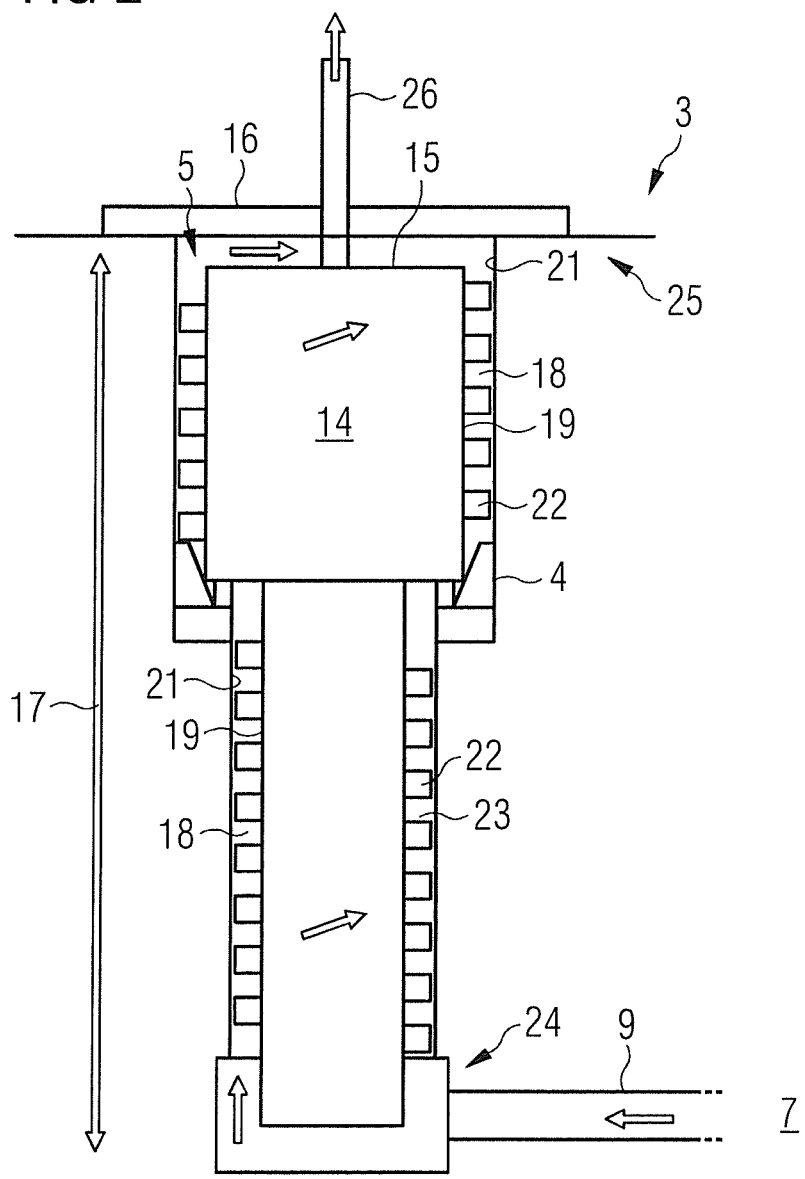
FIG. 2 shows a refrigerator interface sock in a sectional view.

In order to ensure a defined position of the insert 14 within the receiving opening 5, resulting in a defined space 18 between the inner and outer surfaces 19, 21, a support and/or hold structure is employed for holding the insert 14 in place. In the embodiment as illustrated in FIG. 2, the support and/or hold structure is made of a spiral structure 22, e.g. formed by machining or by attaching ridges on the outside surface 19 of the insert 14. If the insert 14 is positioned within the receiving opening 5, this spiral structure 22 contacts the inner surface 21 of the receiving opening 5, defining a spiraled channel 23 from the bottom end 24 of the opening 5 towards the top end 25 of the opening 5. In other words, a passageway is defined, wherein one part of said passageway is formed by the inner surface 21 of the receiving opening 5. The channel 23 is considerably longer than the length 17 of the opening 5, ensuring good heat exchange between the cryogen gas passing through the channel 23 and the warm inner surfaces 21 of the opening 5. The channel 23 is at least two times as long as the length 17 of the opening 5 or at least two times as long as the length of the insert 14, more preferably at least three times as long as the length 17 of the opening 5 or at least three times as long as the length of the insert 14, and more preferably still, at least five times as long as the length 17 of the opening 5 or at least five times as long as the length of the insert 14. The specific design of the passageway is used to direct the gas flow towards the inner surface 21 of the receiving opening 5 in order to ensure an intimate thermal contact.

During transportation, boil-off gas passes from the cryogen vessel 3 to be exhausted to the atmosphere along the passageway provided by the insert 14. This cools the walls of the receiving opening 5 and reduces the ambient heat being conducted into the cryogen vessel 3 by the said walls. In particular, a gas flow pathway is formed from the cryogen vessel 3 to the top end 25 of the receiving opening 5. Boil-off gas flows through the tube 9, enters the receiving opening 5 of the interface sock 4 at its bottom end 24, and runs through the spiraled channel 23, thereby passing over the inner surface 21 of the opening 5. The inner surfaces 21 of the opening 5 are cooled by the boil-off gas passing over it by virtue of the intimate thermal contact between the gas and surface 21. In FIG. 2 the flow of the boil-off gas is indicated by arrows.

The opening 5 is sealed by the top plate 16 having a vent valve 26, through which the cryogen gas exits the opening 5. At the same time, there is no other way for the gas to exit this opening 5, therefore, all the gas is used for cooling purposes. The optimal amounts of boil-off gas flow through the interface sock 4 are most readily determined by experiment to obtain the lowest heat load on the cryogen vessel 3.

Figure 3:
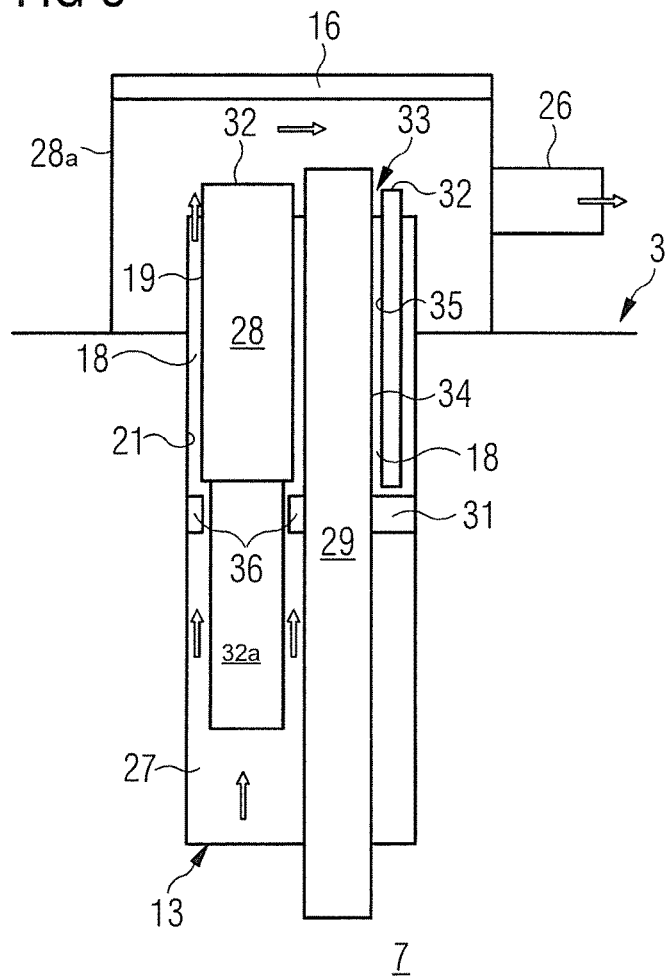
FIG. 3 shows an access neck in a sectional view.

According to an embodiment of the present invention, an insert 28 is also inserted into the access neck 13, as shown in more detail in FIG. 3.

The access neck 13 provides e.g. for escape of cryogen gas in the event of a quench, during operation of the system, and for filling the cryogen 7 into the vessel 3. The receiving opening 27 of the access neck 13 is closed by a turret 28a, having again a sealing top plate 16 and a vent valve 26 for gas exit.

Figure 4:
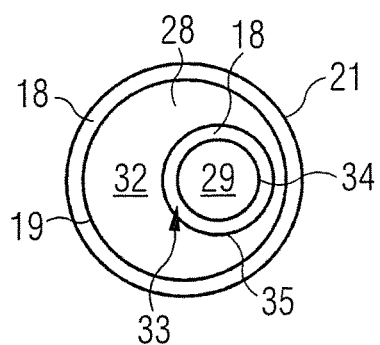
FIG. 4 shows the access neck of FIG. 3 in a top-view.

According to the present invention, for the purpose of transportation any removable device is removed from the receiving opening 27, and an insert 28 is removably inserted into the access neck 13, as shown in more detail in FIGS. 3 and 4. Once the superconducting magnet system 1 is transported to the operational site, the insert 28 is removed and the removed devices are fitted into the access neck 13 again.

The insert 28 is generally similar to the insert 14 as described in connection with FIG. 2. Again, the outer shape of the insert 28 corresponds to the inner contour of the receiving opening 27 of the access neck 13. In this particular case, the receiving opening 27 contains an auxiliary vent tube 29, which is held in position by flange piece 31. This vent tube 29 cannot be removed prior to inserting the insert 28 into the opening 27. Accordingly, the insert 28 is made of a cylindrical main element 32 and an extension piece 32a which protrudes into the opening 27 beyond the flange piece 31. Main element 32 has an eccentric cylindrical passage 33 for receiving the vent tube 29 when being inserted into the receiving opening 27, see FIG. 3.

By this means, the insert 28 is adapted to be positioned adjacent not only to the inner surfaces 21 of the receiving opening 27 but also to the outer surfaces 34 of the vent tube 29, in both cases defining a space 18 to be used as passageway for boil-off gas to pass over said surfaces 21, 34. In other words, the insert 28 provides not only one but two passageways 18, the first passageway being defined between the outer surface 19 of the insert 28 and the inner surface 21 of the receiving opening 27, and the second passageway being defined between the inner surface 35 of the insert's passage 33 and the outer surface 34 of the vent tube 29 located within the receiving opening 27.

In this particular embodiment, the insert 28 positioned in the access neck 13 is a solid body made of low thermal conductivity foam, and no ridges or the like are provided in order to form a spiraled passageway. Instead, the insert 28 is held in position within the receiving opening 27 by means of a support and/or hold structures in form of a number of spacers 36.

However, alternative embodiments may provide insert 28 as a hollow thin-walled vessel of a material of low thermal conductivity, such as stainless steel or a composite material. Alternatively, the insert 28 may be formed of a solid piece of low thermal-conductivity material such as a polymer foam material. Ridges may be provided to define a spiraled pathway, similarly to the embodiment of FIG. 2, in which case the spiraled channel is at least two times as long as the length of the opening 27, more preferably at least three times as long as the length of the opening 27, and more preferably still, at least five times as long as the length of the opening 27.

During transportation, boil-off gas flows along the two passageways 18 provided by the insert 28, thereby cooling the walls of the receiving opening 27 as well as the walls of the vent tube 29.

Although modifications and changes may be suggested by those skilled in the art, it is the intention of the inventors to embody within the patent warranted hereon all changes and modifications as reasonably and properly come within the scope of their contribution to the art.

We claim as our invention:

1. A cryostat assembly comprising:
    a cryostat vessel having an interior that contains a cryostat;
    a refrigerator interface having an opening therein that communicates with said interior of said cryostat vessel, said opening having an inner surface and a length sized to removably receive a cryogenic refrigerator in said opening;
    an insert having an outer surface that allows said insert to be removably inserted into said opening in place of said cryogenic refrigerator, in order to produce at least one passageway for said cryogen through said opening between said outer surface of said insert and at least a portion of said inner surface of said opening, with said cryogen passing over said at least one part of said inner surface of said opening; and
    said outer surface of said insert comprising a plurality of structural elements that define said at least one passageway through said opening and that make said at least one passageway through said opening longer than said length of said opening.

2. The cryostat assembly as claimed in claim 1 wherein said plurality of structural elements are spiral ridges that make said at least one passageway a spiraled passageway proceeding around said outer surface of said insert.

3. The cryostat assembly as claimed in claim 2 wherein said spiraled passageway has a length that is at least two times as long as said length of said opening.

4. The cryostat assembly as claimed in claim 2 wherein said spiraled passageway has a length that is at least two times as long as a length of said insert.

5. The cryostat assembly as claimed in claim 2 wherein said spiraled passageway has a length that is at least three times as long as said length of said opening.

6. The cryostat assembly as claimed in claim 2 wherein said spiraled passageway has a length that is at least three times as long as a length of said insert.

7. The cryostat assembly as claimed in claim 2 wherein said spiraled passageway has a length that is at least five times as long as said length of said opening.

8. The cryostat assembly as claimed in claim 2 wherein said spiraled passageway has a length that is at least five times as long as a length of said insert.

9. The cryostat assembly as claimed in claim 1 wherein said insert comprises a wall that defines an insert body, said wall being comprised of low thermal conductivity material that forms said outer surface of said insert, and said insert body being hollow inside said wall.

10. The cryostat assembly as claimed in claim 1 wherein said insert is a solid body comprised of low thermal conductivity foam.

11. An insert for a refrigerator interface of a cryostat vessel, said cryostat vessel having an interior that contains a cryostat, said refrigerator interface having an opening therein that communicates with said interior of said cryostat vessel, said opening having an inner surface and a length sized to removably receive a cryogenic refrigerator in said opening, said insert comprising:
    an insert body having an outer surface that allows said insert body to be removably inserted into said opening in place of said cryogenic refrigerator, in order to produce at least one passageway for said cryogen through said opening between said outer surface of said insert body and at least a portion of said inner surface of said opening, with said cryogen passing over said at least one part of said inner surface of said opening; and
    said outer surface of said insert body comprising a plurality of spiral ridges that make said at least one passageway a spiraled passageway through said opening that has a length that is longer than said length of said opening.

12. The insert as claimed in claim 11 wherein said length of said spiral passageway is at least two times as long as said length of said opening.

13. The insert as claimed in claim 11 wherein said length of said spiral passageway is at least two times as long as a length of said insert body.

14. The insert as claimed in claim 11 wherein said length of said spiral passageway is at least three times as long as said length of said opening.

15. The insert as claimed in claim 11 wherein said length of said spiral passageway is at least three times as long as the length of said insert body.

16. The insert as claimed in claim 11 wherein said length of said spiral passageway is at least five times as long as said length of said opening.

17. The insert as claimed in claim 11 wherein said length of said spiral passageway is at least five times as long as a length of said insert body.

18. A method for reducing heat input into a cryostat comprising a cryostat vessel having an interior that contains a cryostat, and a refrigerator interface having an opening therein that communicates with said interior of said cryostat vessel, said opening having an inner surface and a length and removably receiving a refrigerator therein, said method comprising:
    removing said refrigerator from said opening and removably placing an insert having an outer surface into said opening in order to produce at least one passageway for said cryogen through said opening between said outer surface of said insert and at least a portion of said inner surface of said opening, with said cryogen passing over said at least one part of said inner surface of said opening; and
    providing said outer surface of said insert with a plurality of structural elements that define said at least one passageway through said opening in order to make said at least one passageway through said opening longer than said length of said opening.

19. The method as claimed in claim 18 comprising providing said outer surface of said insert with a plurality of spiral ridges, as said plurality of structural elements, that makes said at least one passageway a spiraled passageway through said opening.

* * * * *